US006597612B2

United States Patent
Yamauchi

(10) Patent No.: US 6,597,612 B2
(45) Date of Patent: Jul. 22, 2003

(54) SENSE AMPLIFIER CIRCUIT

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/173,155

(22) Filed: Jun. 18, 2002

(65) Prior Publication Data

US 2003/0007404 A1 Jan. 9, 2003

(30) Foreign Application Priority Data

Jul. 4, 2001 (JP) .......................... 2001-203233

(51) Int. Cl.[7] .................. G11C 7/00; H03F 3/45
(52) U.S. Cl. .................. 365/205; 365/208; 327/52; 327/55; 327/57
(58) Field of Search ................. 365/190, 205, 365/207, 208; 327/51–57

(56) References Cited

U.S. PATENT DOCUMENTS

| 5,553,032 A | * | 9/1996 | Taguchi ............... 365/230.03 |
| 6,104,655 A | * | 8/2000 | Tanoi et al. ............. 365/205 |
| 6,205,070 B1 | | 3/2001 | Seevinck et al. ......... 365/205 |

FOREIGN PATENT DOCUMENTS

JP  11-283377  10/1999  ......... G11C/11/419

* cited by examiner

Primary Examiner—Son Mai
(74) Attorney, Agent, or Firm—McDermott, Will & Emery

(57) ABSTRACT

To prevent a resistive delay in a bitline disconnecting circuit, an NMOS latch composing a part of a CMOS latch is composed of four series NMOS transistors, two of which have respective gate electrodes cross-coupled directly to a pair of bitlines without the interposition of the bitline disconnecting circuit therebetween and the other two of which have respective gate electrodes cross-coupled to a pair of first-stage output nodes in a stage subsequent to the bitline disconnecting circuit.

8 Claims, 4 Drawing Sheets

US 6,597,612 B2

SENSE AMPLIFIER CIRCUIT

BACKGROUND OF THE INVENTION

The present invention relates to a sense amplifier circuit for sensing read data in a memory device.

High-speed sense amplifier circuits which operate stably in memory devices such as an SRAM, a DRAM, and a ROM have been in growing demand. As system LSIs have increased in the degree of integration, a higher density has been required particularly of the SRAM which is requested to perform a high-speed and stable read operation even if a cell current is reduced by reductions in the area and voltage of a memory cell.

An example of a full-latch sense amplifier circuit is disclosed in Japanese Unexamined Patent Publication No. HEI 11-283377. The full-latch sense amplifier comprises: a CMOS latch for amplifying the potential difference between a pair of output nodes in response to potential changes on a pair of bitlines which represent data stored in a memory cell; and a bitline disconnecting circuit for cutting off a feedback of the potentials from the pair of output nodes to the pair of bitlines. The bitline disconnecting circuit is composed of a pair of PMOS transistors interposed between the pair of bitlines and the CMOS latch. The pair of PMOS transistors function to reduce a load on the CMOS latch by disconnecting the CMOS latch from the pair of bitlines when the CMOS latch is activated. In short, the pair of PMOS transistors allow the CMOS latch to perform a high-speed amplifying operation by disconnecting the CMOS latch from the pair of bitlines at the time at which a small potential difference responsive to potential changes on the pair of bitlines occurs between the pair of output nodes and activating the CMOS latch.

While the pair of PMOS transistors composing the bitline disconnecting circuit function to increase the amplifying speed after the activation of the CMOS latch, they cause a delay in data transfer due to the resistive components of their own. To reduce the resistive components, the PMOS transistors should be increased in size. However, the increased size has a side effect of increasing coupling noise upon disconnection or the like. Therefore, it has conventionally been inevitable to tolerate a given delay time in data transfer.

SUMMARY OF THE INVENTION

It is therefore an object of the present invention to improve high-speed property and stability of a sense amplifier circuit, while allowing a bitline disconnecting circuit to have effects that have been obtained conventionally.

To attain the object, a sense amplifier circuit according to an embodiment of the present invention is configured such that the gate or source electrodes of MOS transistors composing a latch is coupled directly to bitlines without the interposition of a bitline disconnecting circuit therebetween.

DETAILED DESCRIPTION OF THE INVENTION

Figure 1:
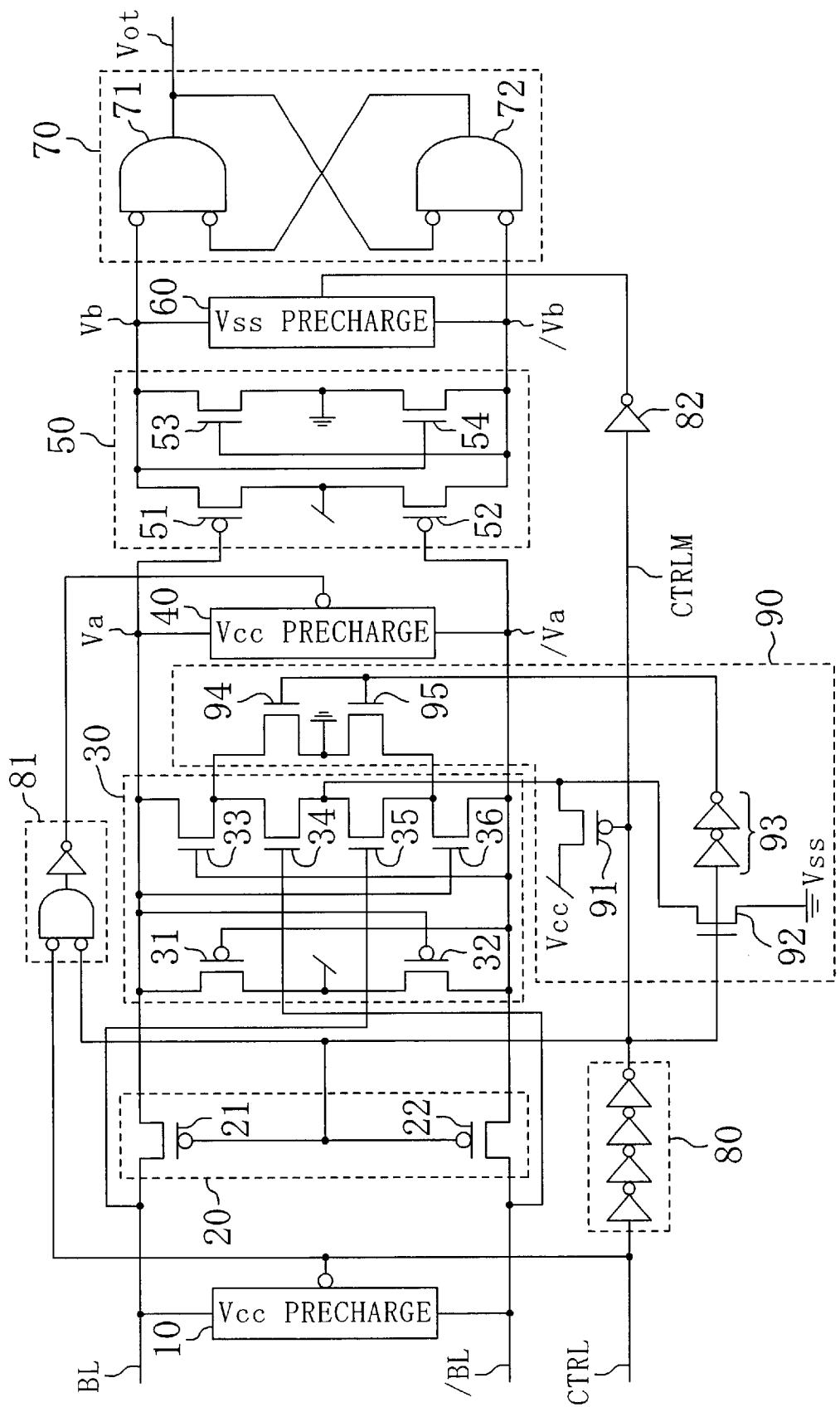
FIG. 1 is a circuit diagram showing an exemplary structure of a sense amplifier circuit according to the present invention.

FIG. 1 shows a first exemplary structure of a sense amplifier circuit according to the present invention. In FIG. 1, 10 is a Vcc precharge circuit, 20 is a bitline disconnecting circuit, 30 is a CMOS latch, 40 is a Vcc precharge circuit, 50 is a differential amplifier, 60 is a Vss precharge circuit, 70 is an output latch, 80 is a delay circuit, 81 is an OR circuit, 82 is an inverter, 90 is a latch control circuit, BL and /BL are a pair of bitlines, CTRL is a disconnection control signal, CTRLM is a delay control signal, Va and /Va are a pair of first-stage output nodes, Vb and /Vb are a pair of second-stage output nodes, and Vot is a sense output. The pair of bitlines BL and /BL are precharged to a power supply voltage Vcc. The pair of first-stage output nodes Va and /Va are also precharged to the power supply voltage Vcc. The pair of second-stage output nodes Vb and /Vb are precharged to a ground voltage Vss.

The bitline disconnecting circuit 20 is composed of two PMOS transistors 21 and 22 disposed between the pair of bitlines BL and /BL and the CMOS latch 30 so as to cut off a feedback of potentials from the pair of first-stage output nodes Va and /Va to the pair of bitlines BL and /BL.

The CMOS latch 30 has two PMOS transistors 31 and 32 composing a PMOS latch and four series NMOS transistors 33, 34, 35, and 36 composing an NMOS latch so as to amplify the potential difference between the pair of first-stage output nodes Va and /Va in response to potential changes on the pair of bitlines BL and /BL. The PMOS transistors 31 and 32 have respective gate electrodes cross-coupled to the pair of first-stage output nodes Va and /Va in the stage subsequent to the bitline disconnecting circuit 20. The NMOS transistors 34 and 35 have respective gate electrodes cross-coupled directly to the pair of bitlines BL and /BL without the interposition of the bitline disconnecting circuit 20 therebetween. On the other hand, the NMOS transistors 33 and 36 have respective gate electrodes cross-coupled to the pair of first-stage output nodes Va and /Va in the stage subsequent to the bitline disconnecting circuit 20.

The differential amplifier 50 is composed of two PMOS transistors 51 and 52 and two NMOS transistors 53 and 54 so as to amplify the potential difference between the pair of second-stage output nodes Vb and /Vb in response to potential changes on the pair of first-stage output nodes Va and /Va. The two PMOS transistors 51 and 52 receive the potentials from the pair of first-stage output nodes Va and /Va at the respective gate electrodes thereof.

The output latch 70 is composed of two NOR gates 71 and 72 each having an input cross-coupled to the output of the other.

The latch control circuit 90 is composed of one PMOS transistor 91, three NMOS transistors 92, 94, and 95, and a delay circuit 93. The NMOS transistor 94 is coupled additionally to an intermediate connecting node between the two series NMOS transistors 33 and 34 of the CMOS latch 30, while the NMOS transistor 95 is coupled additionally to an intermediate connecting node between the other two series NMOS transistors 35 and 36 of the CMOS latch 30. Each of the NMOS transistors 94 and 95 coupled additionally is activated later than the activation of the NMOS latch composed of the four series NMOS transistors 33 to 36.

The structure shown in FIG. 1 allows the NMOS transistors 34 and 35 connected in series in the NMOS latch to respond quickly to the potential changes on the pair of bitlines BL and /BL. The gate electrodes of the NMOS transistors 33 and 36 also respond to the potential changes on the pair of bitlines BL and /BL after a delay time in the bitline disconnecting circuit 20 and the gate potentials are varied with a positive feedback. This permits a higher-speed response to the potential changes on the pair of bitlines BL and /BL than in the conventional sense amplifier circuit.

A positive feedback latch is the most excellent amplifying technology in terms of a high-speed property. However, it has the drawback of aggravating the influence of a slight imbalance between the transistor pair of the latch if the charge is quickly extracted from the source electrodes of the transistor pair. To eliminate the drawback, a control operation has been performed conventionally such that the activation of the sense amplifier circuit is performed stepwise in two stages. At first, the source potentials are varied with a small gradient and, at the time at which initial amplification is completed to a certain extent, the charge is extracted from the source electrodes with a large gradient. However, since the sense amplifier circuit is activated in the two stages, a delay time also occurs. Thus, the malfunction of the sense amplifier circuit and a delay time in amplification have the trade-off relationship therebetween.

To reduce the delay time, the two NMOS transistors 94 and 95 have been added to the NMOS latch, as shown in FIG. 1. Since the potential changes on the pair of bitlines BL and /BL have been inputted directly to the gate electrodes of the NMOS transistors 34 and 35 composing the NMOS latch, activation can be initiated earlier than in the conventional sense amplifier circuit by the delay time in the bitline disconnecting circuit 20 without awaiting the delay time to elapse. If the time saved by the earlier activation is assigned to initial amplification, a sense amplifying operation for rapidly drawing the source potentials in the subsequent stage can be performed earlier than in the conventional one. As a result, a sense amplifier circuit having both a high-speed property and stability can be provided by the present invention.

Since the structure shown in FIG. 1 has the differential amplifier 50 provided in the stage preceding the output latch 70, even if the source potentials are pulled down to the Vss level rather rapidly for higher-speed amplification in the first stage and the potentials at the first-stage output nodes Va and /Va are resultantly pulled down to a level under an intermediate potential, slight noise is filtered by the static operation of the PMOS transistors 51 and 52 and the NMOS transistors 53 and 54 so that the malfunction of the output latch 70 is prevented.

Figure 2:
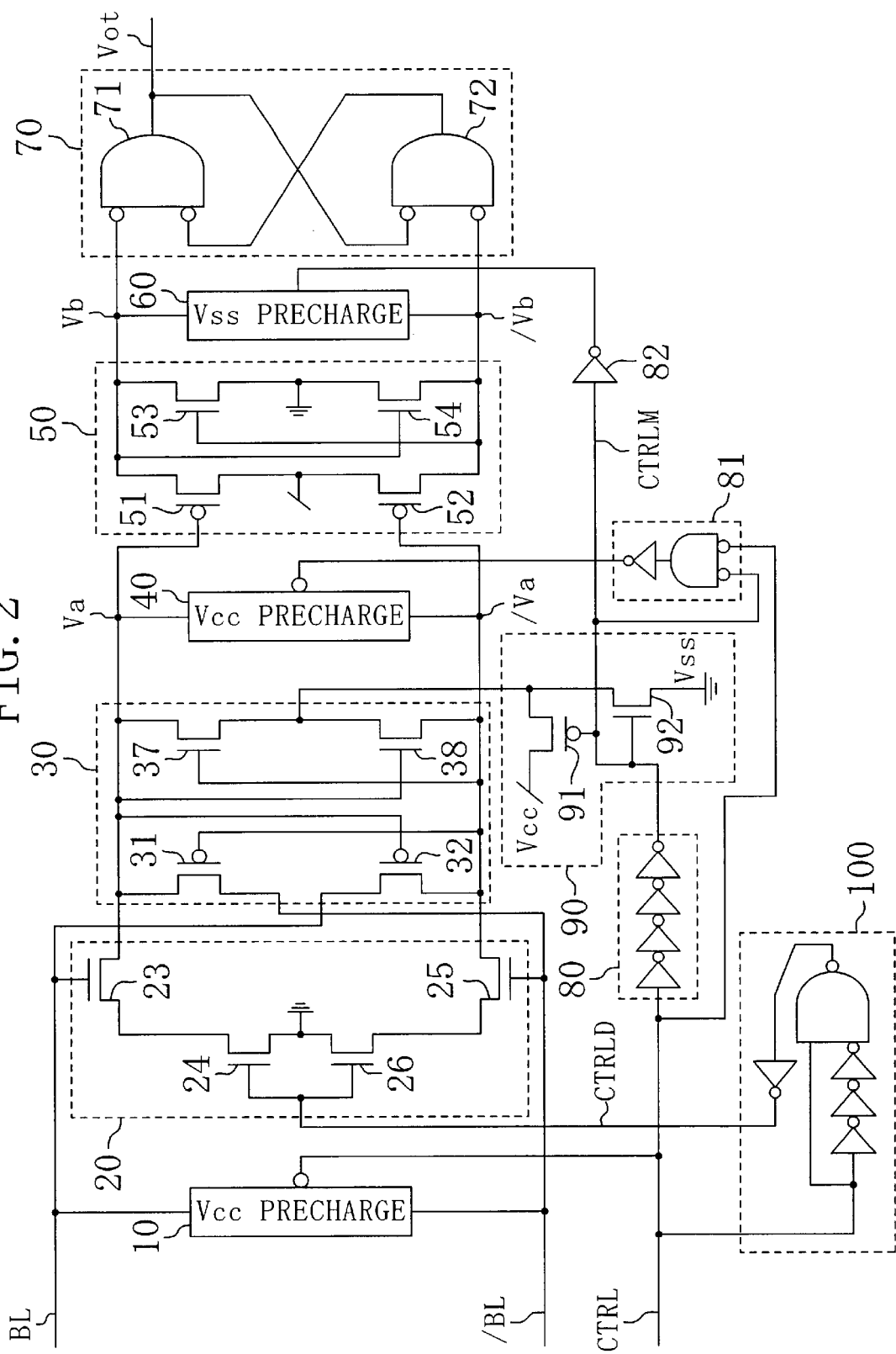
FIG. 2 is a circuit diagram showing another exemplary structure of a sense amplifier circuit according to the present invention.

FIG. 2 shows a second exemplary structure of the sense amplifier circuit according to the present invention. In FIG. 2, the bitline disconnecting circuit 20 has a first pair of MOS transistors composed of two series NMOS transistors 23 and 24 and a second pair of MOS transistors composed of other two series NMOS transistors 25 and 26 so as to cut off a feedback of the potentials from the pair of first-stage output nodes Va and /Va to the pair of bitlines BL and /BL. The series NMOS transistors 23 and 25 have respective gate electrodes coupled to the pair of bitlines BL and /BL, while the other series NMOS transistors 24 and 26 have respective gate electrodes coupled to a control signal (one-shot signal) CTRLD indicative of a timing for cutting off. In FIG. 2, 100 is a one-shot circuit for generating the one-shot signal CTRLD from the disconnection control signal CTRL. The CMOS latch 30 in FIG. 2 has two PMOS transistors 31 and 32 composing a PMOS latch and two NMOS transistors 37 and 38 composing an NMOS latch so as to amplify the potential difference between the pair of first-stage output nodes Va and /Va in response to potential changes on the pair of bitlines BL and /BL. The PMOS transistors 31 and 32 have respective source electrodes cross-coupled directly to the pair of bitlines BL and /BL without the interposition of the bitline disconnecting circuit 20 therebetween and have respective gate electrodes cross-coupled to the pair of first-stage output nodes Va and /Va in the stage subsequent to the bitline disconnecting circuit 20.

The bitline disconnecting circuit 20 shown in FIG. 2 is characterized in that it has the function of shifting differential potentials at the pair of bitlines BL and /BL from the Vcc level to an intermediate potential and the function of initially amplifying the potential difference. The potential shifted in level by the bitline disconnecting circuit 20 can more effectively assist the amplifying operation of the CMOS latch 30. If the CMOS latch is activated in the conventional sense amplifier circuit, only the NMOS latch initially operates since the potentials at the pair of bitlines BL and /BL is in the vicinity of the Vcc level. In addition, the NMOS latch can perform the initial operation only in a region in which the sensitivity is relatively low so that a substantial operation performed thereby is only to shift the differential potential in level. By contrast, the structure shown in FIG. 2 can directly level-shift the potentials at the pair of bitlines BL and /BL, not the differential potentials degraded by the bitline disconnecting circuit 20, prior to the activation of the CMOS latch 30, which is different from the conventional one. This allows a higher-speed and precise level shift and also allows operation in the vicinity of an intermediate level with high sensitivity when the CMOS latch 30 is activated thereafter.

Figure 3:
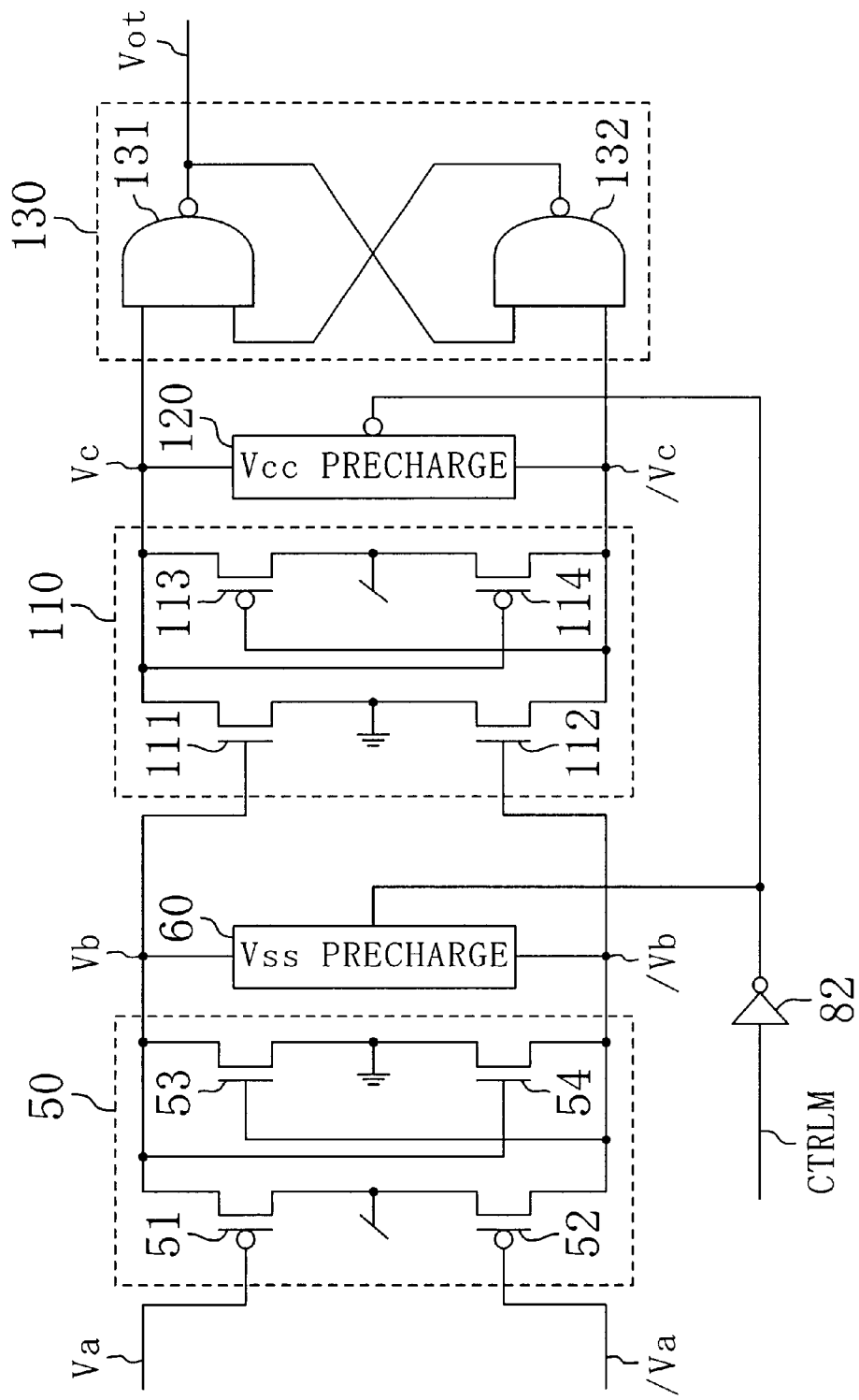
FIG. 3 is a circuit diagram showing a first partial variation of the sense amplifier circuit shown in FIG. 1 or 2.

FIG. 3 shows a first partial variation of the sense amplifier circuit shown in FIG. 1 or 2. In the variation, a pair of third-stage output nodes Vc and /Vc are further provided in the stage subsequent to the pair of second-stage output nodes Vb and /Vb. In FIG. 3, 110 is a differential amplifier, 120 is a Vcc precharge circuit, and 130 is an output latch. The pair of first-stage output nodes Va and /Va are precharged to the power supply voltage Vcc. The pair of second-stage output nodes Vb and /Vb are precharged to the ground voltage Vss. The pair of third-stage output nodes Vc and /Vc are precharged to the power supply voltage Vcc. The differential amplifier 110 is composed of two NMOS transistors 111 and 112 and two PMOS transistors 113 and 114 so as to amplify the potential difference between the pair of third-stage output nodes Vc and /Vc in response to potential changes on the pair of second-stage output nodes Vb and /Vb. The two NMOS transistors 111 and 112 receive the potentials from the pair of second-stage output nodes Vb and /Vb at the respective gate electrodes thereof. The output latch 130 is composed of two NAND gates 131 and 132 each having an input cross-coupled to the output of the other. The structure shown in FIG. 3 can more positively prevent the malfunction of the output latch 130 than the output structure shown in FIG. 1 or 2.

Figure 4:
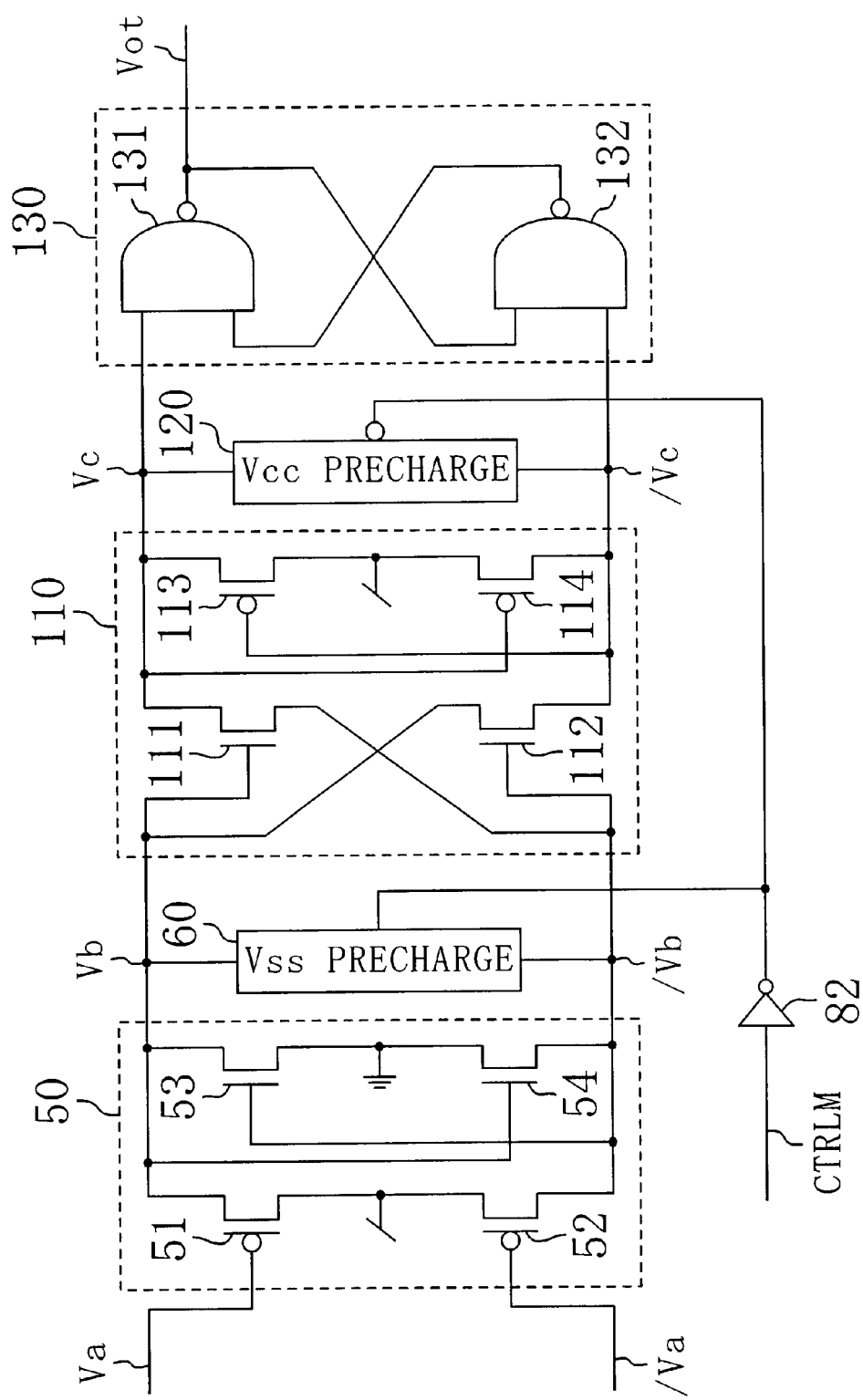
FIG. 4 is a circuit diagram showing a second partial variation of the sense amplifier circuit shown in FIG. 1 or 2.

FIG. 4 shows a second partial variation of the sense amplifier circuit shown in FIG. 1 or 2. In the variation, the NMOS transistors 111 and 112 of the differential amplifier 110 receive the potentials from the pair of second-stage output nodes Vb and /Vb at the gate electrodes and the source electrodes thereof and the source electrodes are cross-coupled to the pair of second-stage output nodes Vb and /Vb. In the structure shown in FIG. 4, the NMOS transistors 111 and 112 can be switched quickly since the gate and source potentials thereof change in opposite directions. Since the structure prevents the two NMOS transistors 111 and 112 from turning on simultaneously and allows extremely stable operation, a threshold level for the logic inversion of the NAND gates 131 and 132 composing the output latch 130 in the subsequent stage may be lowered considerably. Accordingly, a higher-speed operation can be performed.

If a case is assumed where the pair of first-stage output nodes Va and /Va in FIG. 3 or 4 are coupled directly to the output latch 130 composed of the two cross-coupled NAND gates 131 and 132, the output latch 130 malfunctions if one of the two inputs of the output latch 130 reaches the "L" level even momentarily. Since the NMOS latch in the CMOS latch solely executes amplifying operation due to the potential level, the potentials at the first-stage output nodes Va and /Va may be lowered greatly to a nearly intermediate potential level. To suppress the problem, it is normal to set a sufficiently low threshold level for the logic inversion of the NAND gates 131 and 132. However, this leads to an increase in delay time. As stated previously, the output structure shown in FIGS. 1 to 4 is capable of solving the problem.

Although the description has been given to the type in which the pair of bitlines BL and /BL are precharged to the power supply voltage Vcc shown in FIGS. 1 to 4, it will be appreciated that the same concept is also applicable to a type in which the pair of bitlines BL and /BL are precharged to the ground voltage Vss. In the CMOS latch 30 of FIG. 1, e.g., the PMOS transistors 31 and 32 may be replaced appropriately with NMOS transistor structures and the NMOS transistors 33 to 36 may be replaced appropriately with PMOS transistor structures.

What is claimed is:

1. A sense amplifier circuit for sensing read data in a memory device, the sense amplifier circuit comprising:
   a latch for amplifying a potential difference between a pair of output nodes in response to potential changes on a pair of bitlines; and
   a bitline disconnecting circuit for cutting off a feedback of the potentials from the pair of output nodes to the pair of bitlines,
   at least two MOS transistors composing the latch having respective gate or source electrodes coupled directly to the pair of bitlines without interposition of the bitline disconnecting circuit therebetween.

2. The sense amplifier circuit of claim 1, wherein
   the bitline disconnecting circuit has a pair of MOS transistors interposed between the pair of bitlines and the latch,
   the latch has a first pair of series MOS transistors and a second pair of series MOS transistors each having an NMOS-type conductivity if the pair of bitlines are precharged to a power supply voltage and a PMOS-type conductivity if the pair of bitlines are precharged to a ground voltage,
   the first and second pairs of series MOS transistors are coupled in series to each other and respective ones of the first and second pairs of series MOS transistors have respective gate electrodes cross-coupled directly to the pair of bitlines without the interposition of the bitline disconnecting circuit therebetween, while the remaining ones of the first and second pairs of series MOS transistors have respective gate electrodes cross-coupled to the pair of output nodes.

3. The sense amplifier circuit of claim 2, wherein
   one additional transistor is coupled to an intermediate connecting node between the first pair of series MOS transistors, another additional transistor is coupled to an intermediate connecting node between the second pair of series MOS transistors, and each of the additional transistors is activated later than activation of the first and second pairs of series MOS transistors.

4. The sense amplifier circuit of claim 1, wherein
   the bitline disconnecting circuit has a first pair of series MOS transistors and a second pair of series MOS transistors coupled in series to each other and
   respective ones of the first and second pairs of series MOS transistors have respective gate electrodes coupled to the pair of bitlines, while the remaining ones of the first and second pairs of series MOS transistors have respective gate electrodes coupled to a control signal indicative of a timing for cutting off.

5. The sense amplifier circuit of claim 4, wherein
   the latch has a pair of latch transistors each having a PMOS-type conductivity if the pair of bitlines are precharged to a power supply voltage and an NMOS-type conductivity if the pair of bitlines are precharged to a ground voltage, and
   the pair of latch transistors have respective source electrodes cross-coupled directly to the pair of bitlines without the interposition of the bitline disconnecting circuit therebetween and have respective gate electrodes cross-coupled to the pair of output nodes.

6. The sense amplifier circuit of claim 1, further comprising:
   a first differential amplifier for amplifying a potential difference between a pair of second-stage output nodes in response to potential changes on the pair of output nodes, wherein
   the first differential amplifier receives, at respective gate electrodes of a pair of MOS transistors having such a conductivity type as to turn off at a precharging level of the pair of output nodes, the potentials from the pair of output nodes precharged to a level substantially the same as a potential to which the pair of bitlines are precharged and amplifies the potential difference between the pair of second-stage output nodes precharged to a potential opposite to the precharging level of the pair of output nodes.

7. The sense amplifier circuit of claim 6, further comprising:
   a second differential amplifier for amplifying a potential difference between a pair of third-stage output nodes in response to potential changes on the pair of second-stage output nodes, wherein
   the second differential amplifier receives, at respective gate electrodes of a pair of MOS transistors having such a conductivity type as to turn off at a precharging level of the pair of second-stage output nodes, the potentials from the pair of second-stage output nodes and amplifies the potential difference between the pair of third-stage output nodes precharged to a potential opposite to the precharging level of the pair of second-stage output nodes.

8. The sense amplifier circuit of claim 6, further comprising:
   a second differential amplifier for amplifying a potential difference between a pair of third-stage output nodes in response to potential changes on the pair of second-stage output nodes, wherein
   the second differential amplifier receives, at respective gate electrodes and at respective source electrodes of a pair of MOS transistors having such a conductivity type as to turn off at a precharging level of the pair of second-stage output nodes, the respective source electrodes of the pair of MOS transistors cross-coupled to the pair of second-stage output nodes, the potentials from the pair of second-stage output nodes and amplifies the potential difference between the pair of third-stage output nodes precharged to a potential opposite to the precharging level of the pair of second-stage output nodes.

* * * * *